United States Patent
Kodama et al.

(10) Patent No.: US 11,447,678 B2
(45) Date of Patent: Sep. 20, 2022

(54) COOLANT COMPOSITION AND COOLING SYSTEM

(71) Applicant: TOYOTA JIDOSHA KABUSHIKI KAISHA, Toyota (JP)

(72) Inventors: Yasuaki Kodama, Seto (JP); Masao Watanabe, Okazaki (JP); Tomoharu Kataoka, Shizuoka (JP); Daisuke Tokozakura, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/939,354

(22) Filed: Jul. 27, 2020

(65) Prior Publication Data

US 2021/0130672 A1    May 6, 2021

(30) Foreign Application Priority Data

Nov. 1, 2019    (JP) ............................. JP2019-199965

(51) Int. Cl.
*C09K 5/20*    (2006.01)
*H05K 7/20*    (2006.01)
*C09K 5/10*    (2006.01)

(52) U.S. Cl.
CPC .................. *C09K 5/20* (2013.01); *C09K 5/10* (2013.01); *H05K 7/20254* (2013.01); *H05K 7/20872* (2013.01)

(58) Field of Classification Search
CPC ............... C09K 5/20; C09K 5/10; C09K 5/66
See application file for complete search history.

(56) References Cited

U.S. PATENT DOCUMENTS

| | | | | |
|---|---|---|---|---|
| 6,148,634 A * | 11/2000 | Sherwood | ................. | C09K 5/10 62/434 |
| 6,417,153 B1 * | 7/2002 | Owens | ................. | C11D 7/5072 134/40 |
| 6,511,610 B2 * | 1/2003 | Caron | .................... | C09K 5/045 252/364 |
| 10,895,408 B2 * | 1/2021 | Ishida | ..................... | F04B 15/08 |
| 2003/0034477 A1 * | 2/2003 | Minor | .................. | C10M 145/36 252/68 |
| 2003/0209688 A1 * | 11/2003 | Lee | ........................ | C10M 101/02 252/68 |
| 2004/0041122 A1 * | 3/2004 | Minor | ................. | C10M 171/008 252/67 |
| 2004/0222402 A1 * | 11/2004 | Minor | .................. | C10M 131/04 252/68 |
| 2005/0084390 A1 * | 4/2005 | Ueno | .................. | F04C 18/3446 417/313 |
| 2006/0243945 A1 * | 11/2006 | Minor | .................. | A62D 1/0057 252/67 |
| 2007/0104988 A1 | 5/2007 | Nishii et al. | | |
| 2012/0283162 A1 * | 11/2012 | Tsubouchi | ........... | C10M 105/18 508/505 |
| 2018/0100118 A1 * | 4/2018 | Flores-Torres | ....... | C10M 169/04 |
| 2021/0380862 A1 | 12/2021 | Dietl et al. | | |
| 2021/0403782 A1 * | 12/2021 | Dietl | ................ | H01M 8/04029 |

FOREIGN PATENT DOCUMENTS

| | | | | |
|---|---|---|---|---|
| DE | 3424702 A1 * | 2/1986 | ............... | C09K 5/00 |
| DE | 19539096 A1 * | 4/1997 | ............... | C09K 5/10 |
| EP | 0196202 A1 | 10/1986 | | |
| EP | 2 520 637 A1 | 11/2012 | | |
| JP | 61-236884 A | 10/1986 | | |
| JP | 2000241038 A * | 9/2000 | ............... | C09K 5/04 |
| JP | 2005203148 A | 7/2005 | | |
| JP | 2012017391 A | 1/2012 | | |
| JP | 2017017228 A | 1/2017 | | |
| JP | 2020125389 A | 8/2020 | | |
| JP | 2022506355 A | 1/2022 | | |
| WO | 2011080991 A1 | 7/2011 | | |

OTHER PUBLICATIONS

EPO machine translation of JP 2000241038 A to Kushima et al., published Sep. 8, 2000, (Year: 2000).*
EPO machine translation of DE 19539096 A1 to Anh et al., published Apr. 24, 1997 (Year: 1997).*
EPO machine translation of DE 3424702 A1 to Pfitzneretal, published Feb. 6, 1986 (Year: 1986).*
Derwent abstract of KR 2013125880 A, to Young. Published Nov. 20, 2013 (Year: 2013).*

* cited by examiner

*Primary Examiner* — Jane L Stanley
(74) *Attorney, Agent, or Firm* — Dickinson Wright, PLLC

(57) ABSTRACT

This disclosure provides a nonaqueous coolant composition that is excellent in insulation property and heat resistance and has improved heat transfer characteristics. The embodiment is a coolant composition that includes at least one ether compound having 6 or more carbon atoms as a nonaqueous base and is substantially free of water.

4 Claims, 1 Drawing Sheet

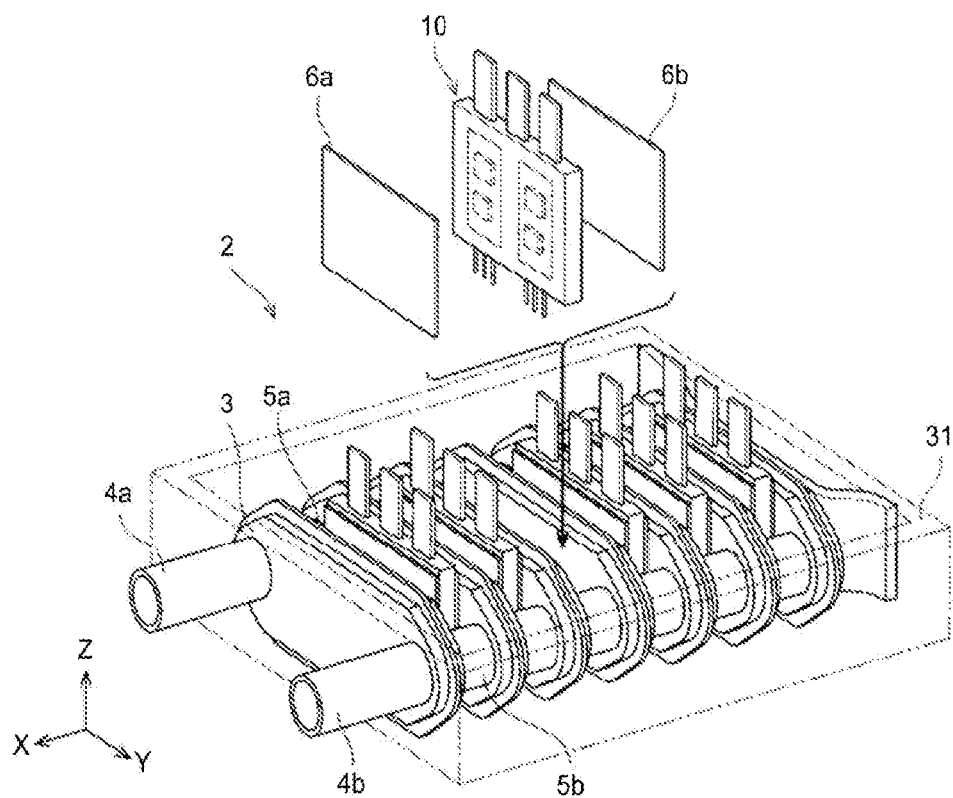

COOLANT COMPOSITION AND COOLING SYSTEM

CROSS REFERENCE TO RELATED APPLICATIONS

The present application claims priority from Japanese patent application JP 2019-199965 filed on Nov. 1, 2019, the entire content of which is hereby incorporated by reference into this application.

BACKGROUND

Technical Field

The present disclosure relates to a coolant composition and a cooling system that comprises the coolant composition.

Background Art

A vehicle with traction motor, such as a hybrid vehicle and an electric vehicle, includes a power control unit (PCU) for appropriately controlling an electric power. The PCU includes an inverter that drives the motor, a boost converter that controls a voltage, a DC/DC converter that steps down a high voltage, and the like. The inverter or the converter includes a power card as a card-type power module that includes semiconductor devices, and the power card generates a heat caused by its switching action. Therefore, the inverter and the converter are equipment that possibly becomes to have a high temperature due to the heat generation. Heat generation equipment in the vehicle with traction motor includes, for example, a battery in addition to the inverter and the converter. Accordingly, the vehicle with traction motor includes a cooling system for cooling the inverter, the converter, the battery, and the like.

For example, JP 2017-017228 A discloses a configuration of a semiconductor apparatus used for an inverter of a drive system in a vehicle with traction motor (for example, an electric vehicle or a hybrid vehicle) (FIG. 1). A semiconductor apparatus 2 of FIG. 1 is a unit where a plurality of power cards 10 and a plurality of coolers 3 are stacked. In FIG. 1, reference numeral 10 is attached to only one power card, and reference numerals to the other power cards are omitted. For showing the whole semiconductor apparatus 2, a case 31, which houses the semiconductor apparatus 2, is illustrated by dotted lines. The one power card 10 is sandwiched between the two coolers 3. An insulating plate 6a is sandwiched between the power card 10 and one of the coolers 3, and an insulating plate 6b is sandwiched between the power card 10 and the other of the coolers 3. Greases are applied between the power card 10 and the insulating plates 6a and 6b. Greases are applied also between the insulating plates 6a and 6b and the coolers 3. For easy understanding, FIG. 1 illustrates the one power card 10 and the insulating plates 6a and 6b extracted from the semiconductor apparatus 2. The power card 10 houses a semiconductor device. The power card 10 is cooled by a refrigerant passing through the cooler 3. The refrigerant is a liquid, typically water. The power cards 10 and the coolers 3 are alternately stacked, and the coolers 3 are positioned at both ends in a stacking direction of the unit. The plurality of coolers 3 are coupled by coupling pipes 5a and 5b. A refrigerant supply pipe 4a and a refrigerant discharge pipe 4b are coupled to the cooler 3 positioned at the one end in the stacking direction of the unit. The refrigerant supplied through the refrigerant supply pipe 4a is distributed to every cooler 3 through the coupling pipes 5a. The refrigerant absorbs the heat from the adjacent power card 10 while passing through each cooler 3. The refrigerant that has passed through each cooler 3 passes through the coupling pipe 5b and is discharged from the refrigerant discharge pipe 4b.

As a coolant, a nonaqueous coolant, such as a mineral oil, an aqueous coolant including water (for example, a mixture of ethylene glycol and water), and the like are generally used.

SUMMARY

As the configuration of the semiconductor apparatus disclosed in JP 2017-017228 A, generally, the coolant circulates near the power cards and the batteries. Therefore, in the vehicle with traction motor, such as the hybrid vehicle and the electric vehicle, when the coolant leaks due to an accident, the leaked coolant possibly contacts a terminal of the power card, the battery, or the like to cause a short circuit. Therefore, from an aspect to reduce the occurrence of the secondary accident in the case of the coolant leakage, the coolant is desired to have an excellent insulation property.

Since the coolant absorbs the heat from an object to be cooled, the coolant itself is to be heated, and consequently, the coolant becomes to have a high temperature in some cases. When the coolant becomes to have a high temperature, components in the coolant are decomposed or oxidized to reduce the insulation property of the coolant in some cases. Therefore, the coolant is desired to have a heat resistance where the insulation property is less likely to decrease when the coolant is heated.

The generally used mineral oil is excellent in insulation property and heat resistance while having room for improvement in cooling performance, that is, heat transfer characteristics. The mixture of ethylene glycol and water is excellent in cooling performance while having low insulation property.

Therefore, the present disclosure provides a nonaqueous coolant composition that is excellent in insulation property and heat resistance and has improved heat transfer characteristics.

Exemplary aspects of the embodiment will be described as follows.

(1) A coolant composition comprises at least one ether compound having 6 or more carbon atoms as a nonaqueous base. The coolant composition is substantially free of water.

(2) The coolant composition according to (1), wherein the ether compound comprises at least one selected from the group consisting of an aliphatic ether compound and an aromatic ether compound.

(3) The coolant composition according to (1), wherein the ether compound comprises at least one aliphatic ether compound.

(4) The coolant composition according to (3), wherein the aliphatic ether compound comprises at least one saturated aliphatic ether compound.

(5) The coolant composition according to (1), wherein the ether compound comprises at least one aromatic ether compound.

(6) The coolant composition according to any one of (1) to (5), wherein the ether compound has 6 to 14 carbon atoms.

(7) The coolant composition according to any one of (1) to (6), wherein a content of the ether compound in the coolant composition is 10 mass % or more.
(8) The coolant composition according to any one of (1) to (7), further comprises a mineral oil.
(9) The coolant composition according to (8), wherein a content of the ether compound in the coolant composition is 10 to 90 mass %, and a content of the mineral oil in the coolant composition is 10 to 90 mass %.
(10) The coolant composition according to (8), wherein a content of the ether compound in the coolant composition is 30 to 70 mass %, and a content of the mineral oil in the coolant composition is 30 to 70 mass %.
(11) The coolant composition according to any one of (1) to (10), wherein a conductivity at 20° C. is 0.1 μS/cm or less.
(12) A cooling system that comprises the coolant composition according to any one of (1) to (11) as a refrigerant.
(13) The cooling system according to (12) for cooling heat generation equipment mounted to a vehicle with traction motor.
(14) The cooling system according to (13), wherein the heat generation equipment is an inverter, a converter, a generator, a motor, or a battery.
(15) The cooling system according to (13) or (14), wherein the heat generation equipment includes a power card, and the coolant composition is in physical contact with the power card.

The present disclosure can provide the nonaqueous coolant composition that is excellent in insulation property and heat resistance and has improved heat transfer characteristics.

BRIEF DESCRIPTION OF THE DRAWINGS

FIG. 1 is a schematic perspective view illustrating an exemplary configuration of a semiconductor apparatus used for an inverter of a drive system in a vehicle with traction motor.

DETAILED DESCRIPTION

1. Coolant Composition

The embodiment is a coolant composition that comprises at least one ether compound having 6 or more carbon atoms as a nonaqueous base and is substantially free of water.

The coolant composition according to the embodiment is excellent in insulation property and heat resistance and has improved heat transfer characteristics. Especially, since the coolant composition according to the embodiment is excellent in insulation property, a secondary accident, such as a short circuit, can be suppressed when the coolant composition leaks due to an accident or the like. Since the coolant composition according to the embodiment is excellent in heat resistance, the insulation property is less likely to decrease when the coolant composition is heated in a cooling system. Furthermore, since the coolant composition according to the embodiment has improved heat transfer characteristics, the coolant composition has a high cooling performance. Therefore, the coolant composition according to the embodiment is usable in a vehicle with traction motor, such as a hybrid vehicle and an electric vehicle in some embodiments.

The coolant composition according to the embodiment provides another effect as follows. Conventionally, a typically used ethylene glycol based aqueous coolant has excellent heat transfer characteristics but has a poor insulation property. Therefore, as illustrated in FIG. 1, a component side of a cooling object needed to have an insulation structure. Specifically, as illustrated in FIG. 1, it was necessary to dispose the insulating plates (6a and 6b of FIG. 1) to ensure the insulation between the electronic equipment and the coolant composition. However, disposing the insulating plates degrades the heat transfer characteristics between the coolant composition and the electronic equipment, thus consequently reducing the cooling performance. Since the coolant composition according to the embodiment is excellent in insulation property, the disposing of the insulating plates can be eliminated, and as a result, a cooling system excellent in cooling performance can be provided.

The coolant composition according to the embodiment provides another effect as follows. As an exemplary means for cooling the electronic equipment, there has been a method to at least partially (partially or completely) immerse the electronic equipment in the coolant composition. For example, for the cooling, the power card can be disposed to be in physical contact with the coolant composition. While this cooling structure has an extremely excellent heat transfer efficiency, the coolant composition requires the extremely excellent insulation property because the electronic equipment and coolant composition are in direct contact. The coolant composition according to the embodiment is extremely excellent in insulation property, non-toxic, and less likely to cause corrosion. Thus, the coolant composition according to the embodiment is usable in the cooling system that has this cooling structure in some embodiments.

The coolant composition according to the embodiment is nonaqueous, includes the nonaqueous base as the component, and is substantially free of water.

In this description, "substantially free of water" means that the coolant composition does not include water in a content range in which expression of the effect of the embodiment is interfered, may mean that the water content in the coolant composition is 1.0 mass % or less, may mean that the water content in the coolant composition is 0.5 mass % or less, may mean that the water content in the coolant composition is 0.1 mass % or less, or may mean that the water content in the coolant composition is 0 mass % (undetectable).

The coolant composition according to the embodiment includes at least one ether compound having 6 or more carbon atoms as the nonaqueous base. The ether compound having 6 or more carbon atoms is excellent in insulation property, heat transfer characteristics, and heat resistance. One ether compound may be used alone, or 2 or more ether compounds may be used in combination.

The ether compound is a compound that has a structure in which two hydrocarbon groups are bonded via an oxygen atom. In one embodiment, the ether compound comprises at least one selected from the group consisting of an aliphatic ether compound and an aromatic ether compound. In one embodiment, the ether compound comprises at least one aliphatic ether compound. In one embodiment, the ether compound comprises at least one aromatic ether compound.

The aliphatic ether compound may be a saturated aliphatic ether compound, or may be an unsaturated aliphatic ether compound. The unsaturated aliphatic ether compound includes at least one unsaturated bond. The two hydrocarbon groups bonded to the oxygen atom in the aliphatic ether compound are each independent, and may be linear, or may be branched chain. At least one of the two hydrocarbon groups may have a cyclic structure. One aliphatic ether compound may be used alone, or 2 or more aliphatic ether compounds may be used in combination.

The aliphatic ether compound is the saturated aliphatic ether compound in some embodiments. The saturated aliphatic ether compound includes, for example, dipropyl ether, diisopropyl ether, methyl amyl ether, ethyl isoamyl ether, dibutyl ether, diisobutyl ether, dipentyl ether (amyl ether), diisopentyl ether (isoamyl ether), dicyclopentyl ether, dihexyl ether, dicyclohexyl ether, diheptyl ether, dioctyl ether, or a mixture of them.

The aliphatic ether compound may be indicated by the formula (1).

[Chem. 1]

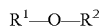

$$R^1\text{—}O\text{—}R^2$$

[In the formula, $R^1$ and $R^2$ are each independently an aliphatic hydrocarbon group having 3 or more carbon atoms].

In the formula (1), $R^1$ and $R^2$ each independently have carbon atoms of 3 to 7 in some embodiments. The aliphatic hydrocarbon group may be a saturated aliphatic hydrocarbon group or may be an unsaturated aliphatic hydrocarbon group. The aliphatic hydrocarbon group is a saturated aliphatic hydrocarbon group in some embodiments. The aliphatic hydrocarbon group may be linear, may be branched chain, or may be cyclic. The aliphatic hydrocarbon group is linear or branched chain in some embodiments.

The aromatic ether compound is an ether compound in which at least one of the two hydrocarbon groups bonded via the oxygen atom includes an aromatic hydrocarbon group. One aromatic ether compound may be used alone, or 2 or more aromatic ether compounds may be used in combination.

The aromatic ether compound includes, for example, methyl phenyl ether, ethyl phenyl ether, diphenyl ether, phenyl benzyl ether, dibenzyl ether, naphthyl methyl ether, or a mixture of them.

The aromatic ether compound may be indicated by the formula (2).

[Chem. 2]

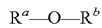

$$R^a\text{—}O\text{—}R^b \quad (2)$$

[In the formula, $R^a$ and $R^b$ are each independently an aliphatic hydrocarbon group having 1 or more carbon atoms or an aromatic hydrocarbon group having 6 or more carbon atoms, and at least one of $R^a$ or $R^b$ is an aromatic hydrocarbon group having 6 or more carbon atoms].

In the formula (2), the aliphatic hydrocarbon group may have carbon atoms of 1 to 6, or 2 to 4 in some embodiments. The aliphatic hydrocarbon group may be a saturated aliphatic hydrocarbon group or may be an unsaturated aliphatic hydrocarbon group. The aliphatic hydrocarbon group is a saturated aliphatic hydrocarbon group in some embodiments. The aliphatic hydrocarbon group may be linear, may be branched chain, or may be cyclic. The aliphatic hydrocarbon group is linear or branched chain in some embodiments. The aromatic hydrocarbon group has carbon atoms of 6 to 10 in some embodiments.

The ether compound has 6 or more carbon atoms. The number of carbon atoms of the ether compound may be 6 to 14, and is 7 to 12, or 8 to 10 in some embodiments from the aspect of the boiling point and/or the viscosity of the ether compound.

A content of the ether compound in the coolant composition is, for example, 10 mass % or more, and may be 20 mass % or more, 30 mass % or more, 40 mass % or more, or 50 mass % or more. By setting the content of the ether compound to 10 mass % or more, the insulation property, the heat transfer characteristics, and the heat resistance of the coolant composition can be improved. The content of the ether compound in the coolant composition is, for example, 100 mass % or less, and may be 90 mass % or less.

The coolant composition according to the embodiment may include another nonaqueous base in addition to the ether compound. The other nonaqueous base includes, for example, a mineral oil, a synthetic oil, or a mixture of them. The synthetic oil includes, for example, an ester synthetic oil, a synthetic hydrocarbon oil, a silicone oil, a fluorinated oil, or a mixture of them. One of them may be used alone, or 2 or more may be used in mixture.

The coolant composition according to the embodiment may include the mineral oil as the nonaqueous base in addition to the ether compound. By including the mineral oil, the insulation property of the coolant composition can be improved. The mineral oil includes, for example, a paraffin mineral oil, a naphthenic mineral oil, or a mixture of them. One base oil may be used alone, or 2 or more base oils may be used in mixture.

While a kinematic viscosity (40° C.) of the mineral oil is not specifically limited, the kinematic viscosity is, for example, 0.5 to 100 mm$^2$/s, and may be 0.5 to 20 mm$^2$/s or 0.5 to 10 mm$^2$/s.

A content of the mineral oil in the coolant composition may be 10 mass % or more, and is 20 mass % or more, 30 mass % or more, 40 mass % or more, or 50 mass % or more in some embodiments.

When the coolant composition includes the mineral oil, the content of the ether compound in the coolant composition is 10 to 90 mass % and the content of the mineral oil in the coolant composition is 10 to 90 mass % in some embodiments. When the coolant composition includes the mineral oil, the content of the ether compound in the coolant composition is 30 to 70 mass % and the content of the mineral oil in the coolant composition is 30 to 70 mass % in some embodiments. When the coolant composition includes the mineral oil, the content of the ether compound in the coolant composition is 40 to 60 mass % and the content of the mineral oil in the coolant composition is 40 to 60 mass % in some embodiments.

The coolant composition according to the embodiment may include an optional component, such as an antioxidant agent, a rust inhibitor, a friction modifier, an anticorrosive, a viscosity index improver, a pour point depressant, a dispersing agent/surfactant, an antiwear agent, or a solid lubricant, in addition to the above-described components. A content of the optional component in the coolant composition is, for example, 0.1 to 20 mass %, and may be 10 mass % or less, 5 mass % or less, or 1 mass % or less.

A kinematic viscosity (20° C.) of the coolant composition according to the embodiment is, for example, 0.1 to 100 mm$^2$/s, and may be 0.1 to 10 mm$^2$/s.

Since the coolant composition is forcibly circulated in the cooling system, the viscosity may be lowered. The viscosity of the coolant composition can be adjusted by, for example, a viscosity and an amount of the mineral oil to be added. The kinematic viscosity (40° C.) of the coolant composition according to the embodiment may be 0.1 to 10 mm$^2$/s.

A conductivity (20° C.) of the coolant composition according to the embodiment may be 0.1 ΩS/cm or less, 0.01 μS/cm or less, or 0.001 μS/cm or less.

2. Cooling System

The coolant composition according to the embodiment is used for the cooling system, and may be used for the cooling system mounted to a vehicle with traction motor. That is, an aspect of the embodiment is a cooling system where the coolant composition according to the embodiment is used as a refrigerant. An aspect of the embodiment is a cooling system for cooling heat generation equipment mounted to a vehicle with traction motor. An aspect of the embodiment is a vehicle with traction motor that includes the cooling system according to the embodiment and heat generation equipment cooled by the cooling system.

The "vehicle with traction motor" in this description includes both an electric vehicle and a hybrid vehicle. The electric vehicle includes only a traction motor as a power source without an engine. The hybrid vehicle includes both the traction motor and the engine as the power source. A fuel cell vehicle is also included in the "vehicle with traction motor."

As one of the environmental measures, the vehicle with traction motor, such as the hybrid vehicle, the fuel cell vehicle, and the electric vehicle, that travels by a driving force of the motor has attracted attention. In this type of vehicle, since the heat generation equipment, such as a motor, a generator, an inverter, a converter, and a battery, becomes to have a high temperature due to the heat generation, the heat generation equipment needs to be cooled. As described above, the coolant composition according to the embodiment is excellent in insulation property and improved in heat transfer characteristics. Therefore, a secondary accident, such as a short circuit, is less likely to occur even when the coolant composition leaks due to an accident or the like. In addition, the coolant composition according to the embodiment is excellent in cooling performance. Since the coolant composition according to the embodiment is excellent in heat resistance as described above, the insulation property is less likely to decrease when heated in the cooling system. Therefore, the coolant composition according to the embodiment is usable for the cooling system of the vehicle with traction motor in some embodiments.

The cooling system includes, for example, a refrigerant pipe through which the coolant composition as a refrigerant flows, a reservoir tank that houses the coolant composition, a circulation device for circulating the coolant composition in a circulation passage, or a cooling device for decreasing the temperature of the coolant composition. The circulation device includes, for example, an electric pump. The cooling device includes, for example, a radiator, a chiller, or an oil cooler. A cooling object for the cooling system is the heat generation equipment, such as the inverter, the converter, the generator, the motor, or the battery.

The configuration of the cooling system is not specifically limited. The cooling system includes, for example, the refrigerant pipe, the reservoir tank, the electric pump, the radiator, and a cooling unit included in the heat generation equipment. The cooling unit is a unit to receive a heat from the heat generation equipment, and for example, the cooler 3 of FIG. 1 corresponds to the cooling unit. For example, after the coolant composition is pumped up from the reservoir tank by the electric pump, the heat generation equipment is cooled by the cooling unit, and subsequently, the coolant composition is returned to the reservoir tank via the radiator on a downstream side. Since the temperature of the coolant composition that has cooled the cooling unit increases, the temperature of the coolant composition that has increased in temperature is decreased by the radiator. A configuration where the oil cooler is disposed on the way of the refrigerant pipe to cool the motor by this oil cooler can be employed.

The cooling system according to the embodiment may be used for the vehicle with traction motor. That is, an aspect of the embodiment is a vehicle with traction motor that includes the cooling system according to the embodiment. An aspect of the embodiment is an electric vehicle, a hybrid vehicle, or a fuel cell vehicle that includes the cooling system according to the embodiment.

As described above, the coolant composition according to the embodiment is extremely excellent in insulation property, non-toxic, and less likely to cause corrosion. Thus, the coolant composition according to the embodiment is usable for the cooling system that has a cooling structure where the electronic equipment is at least partially (partially or completely) immersed in the coolant composition in some embodiments. The electronic equipment includes, for example, a power card and a CPU, which include semiconductor devices. Specific configurations of this cooling system can be found in, for example, U. S. Pat. No. 7,403,392 or US Patent Application Publication No. 2011-0132579 A. Specifically, an aspect of the embodiment is the vehicle with traction motor where the heat generation equipment includes the power card, and the coolant composition is in physical contact with the power card.

EXAMPLES

While the following describes the embodiment with examples, the disclosure is not limited to the examples.
<Material>
Dibutyl ether (manufactured by Tokyo Chemical Industry)
Isoamyl ether (manufactured by Tokyo Chemical Industry)
Mineral oil: kinematic viscosity (20° C.) 0.1 to 10 mm$^2$/s
Conventional LLC (Toyota genuine, product name: Super Long-Life Coolant, including ethylene glycol and additive)
Ethylene glycol (manufactured by Tokyo Chemical Industry) (hereinafter also referred to as EG)
Ion exchanged water
<Preparation Method>
Respective coolant compositions were prepared with compositions described in Table 1 and Table 2 below.
<Conductivity>
The conductivities of the respective coolant compositions at 20° C. were measured using a conductivity measuring machine (manufactured by Yokogawa Electric Corporation, SC72 Personal Handheld Conductivity Meter, sensor: SC72SN-11). Table 1 and Table 2 indicate the results.
<Heat Transfer Characteristics>
The heat transfer characteristics of the respective coolant compositions were compared by calculating the cooling performances of the radiator, the oil cooler, and the inverter, which used the respective coolant compositions as the refrigerants, with formulas below. Table 1 and Table 2 indicate the results.
(Cooling Performance in Radiator)
The cooling performances in the radiators using the respective coolant compositions as the refrigerants were calculated with the formula below. The refrigerants were adjusted to have inlet temperatures at 65° C. Other conditions were as follows. Ventilation volume to radiator: 4.5 m/sec, refrigerant flow rate: 10 L/min, temperature difference between refrigerant and external air: 40° C. (refrigerant: 65° C., external air: 25° C.).

$$Q_W = \frac{V_W \cdot \gamma_W \cdot 10^{-3}}{60} \cdot C_{PW} \cdot (t_{W1} - t_{W2}) \quad \text{[Math. 1]}$$

$Q_W$: cooling performance, $V_W$: refrigerant flow rate, $\gamma_W$: refrigerant density, $C_{PW}$: refrigerant specific heat, $t_{W1}$: refrigerant inlet temperature, $t_{W2}$: refrigerant outlet temperature (Cooling Performance in Oil Cooler)

The cooling performances in the oil coolers using the respective coolant compositions as the refrigerants were calculated with the formula below. The refrigerants were adjusted to have the inlet temperatures at 30° C. Other conditions were as follows. Transmission oil flow rate: 6 L/min, refrigerant flow rate: 10 L/min, temperature difference between transmission oil and refrigerant: 30° C. (transmission oil: 60° C., refrigerant: 30° C.).

$$Q_W = \frac{V_W \cdot \gamma_W \cdot 10^{-3}}{60} \cdot C_{PW} \times (t_{W1} - t_{W2}) \quad [\text{Math. 2}]$$

$Q_W$: cooling performance, $V_W$: refrigerant flow rate, $\gamma_W$: refrigerant density, $C_{PW}$: refrigerant specific heat, $t_{W1}$: refrigerant inlet temperature, $t_{W2}$: refrigerant outlet temperature (Cooling Performance in Inverter)

The cooling performances in the inverters using the respective coolant compositions as the refrigerants were calculated with the formula below. The refrigerants were adjusted to have the inlet temperatures at 65° C. Other conditions were as follows. Heat generation amount of inverter (power card): 500 W, refrigerant flow rate: 10 L/min.

$$Q_W = \frac{V_W \cdot \gamma_W \cdot 10^{-3}}{60} \cdot C_{PW} \cdot (t_{W1} - t_{W2}) \quad [\text{Math. 3}]$$

$Q_W$: cooling performance, $V_W$: refrigerant flow rate, $\gamma_W$: refrigerant density, $C_{PW}$: refrigerant specific heat, $t_{W1}$: refrigerant inlet temperature, $t_{W2}$: refrigerant outlet temperature <Heat Resistance>

The respective coolant compositions were put into heat-resistant bottles, and heated at 120° C. for 216 hours. Subsequently, the conductivities of the coolant compositions were measured. Table 1 and Table 2 indicate the results.

TABLE 1

|  | Component | Example 1 | Example 2 | Example 3 | Example 4 | Example 5 | Example 6 |
|---|---|---|---|---|---|---|---|
| Composition (mass %) | Dibutyl Ether | 100 | — | 50 | — | 10 | — |
|  | Isoamyl Ether | — | 100 | — | 50 | — | 10 |
|  | Conventional LLC (EG + Additive) | — | — | — | — | — | — |
|  | Ethylene Glycol | — | — | — | — | — | — |
|  | Mineral Oil | — | — | 50 | 50 | 90 | 90 |
|  | Ion Exchanged Water | — | — | — | — | — | — |
| Sum |  | 100 | 100 | 100 | 100 | 100 | 100 |
| Evaluation | Conductivity | <0.0009 | <0.0009 | <0.0009 | <0.0009 | <0.0009 | <0.0009 |
|  | Cooling Performance (Radiator) | 236 | 235 | 216 | 216 | 204 | 204 |
|  | Cooling Performance (Oil Cooler) | 74.8 | 75.1 | 74.2 | 74.4 | 74.0 | 74.0 |
|  | Cooling Performance (Inverter) | 5.7 | 5.7 | 5.5 | 5.5 | 5.5 | 5.5 |
|  | Heat Resistance (Conductivity after Heating) | <0.0009 | <0.0009 | <0.0009 | <0.0009 | <0.0009 | <0.0009 |

TABLE 2

|  | Component | Comparative Example 1 | Comparative Example 2 | Comparative Example 3 | Comparative Example 4 |
|---|---|---|---|---|---|
| Composition (mass %) | Dibutyl Ether | — | — | — | — |
|  | Isoamyl Ether | — | — | — | — |
|  | Conventional LLC (EG + Additive) | 50 | — | — | — |
|  | Ethylene Glycol | — | 50 | — | — |
|  | Mineral Oil | — | — | 100 | — |
|  | Ion Exchanged Water | 50 | 50 | — | 100 |
| Sum |  | 100 | 100 | 100 | 100 |
| Evaluation | Conductivity | 7000 | 0.6 | <0.0009 | 0.3 |
|  | Cooling Performance (Radiator) | 371 | 368 | 197 | 458 |
|  | Cooling Performance (Oil Cooler) | 115 | 114 | 73 | 124 |
|  | Cooling Performance (Inverter) | 7.1 | 7.0 | 5.4 | 7.7 |
|  | Heat Resistance (Conductivity after Heating) | 7000 | 3.1 | <0.0009 | 0.3 |

The coolant composition of any example had the conductivity less than 0.0009 µS/cm, and was excellent in insulation property. The coolant composition of any example had the cooling performance higher than the cooling performance of the mineral oil (comparative example 3), and it was confirmed that the improved heat transfer characteristics were provided. Especially, the cooling performance was improved as the content of the ether compound increased. Furthermore, the coolant composition of any example was excellent in heat resistance without decrease in insulation property after heating.

Meanwhile, in the comparative examples 1, 2 and 4 that had configurations of conventional coolant compositions (mixture of ethylene glycol and water, or water alone), the conductivities were high and the insulation properties were insufficient. For the coolant composition of the comparative example 2, it is understood that the heat resistance is poor because of the conductivity increased by heating.

From the results described above, it was proved that the coolant compositions according to the embodiment were excellent in insulation property and heat resistance, and improved in heat transfer characteristics.

Throughout the present specification, it should be understood that the singular forms also include the plural concept unless specifically stated otherwise. Thus, it should be understood that singular articles (for example, "a", "an", "the", or the like in the case of English) also include the plural concept unless otherwise stated.

Upper limit values and/or lower limit values of respective numerical ranges described in this description can be appropriately combined to specify an intended range. For example, upper limit values and lower limit values of the numerical ranges can be appropriately combined to specify an intended range, upper limit values of the numerical ranges can be appropriately combined to specify an intended range, and lower limit values of the numerical ranges can be appropriately combined to specify an intended range.

While the embodiment has been described in detail, the specific configuration is not limited to the embodiment. Design changes within a scope not departing from the gist of the disclosure are included in the disclosure.

What is claimed is:

1. A cooling system that comprises a coolant composition as a refrigerant, the coolant composition comprising:

at least one aliphatic ether compound of formula $R^1$—O—$R^2$, and having 6 to 14 carbon atoms as a nonaqueous base, and a mineral oil;

wherein the coolant composition is substantially free of water;

wherein a content of the ether compound in the coolant composition is 10 to 90 mass %, and wherein a content of the mineral oil in the coolant composition is 10 to 90 mass %.

2. The cooling system according to claim 1 for cooling heat generation equipment mounted to a vehicle with a traction motor.

3. The cooling system according to claim 2, wherein the heat generation equipment is at least one selected from the group consisting of an inverter, a converter, a generator, a motor, a battery, and the traction motor.

4. The cooling system according to claim 2, wherein the heat generation equipment includes a power card, and the coolant composition is in physical contact with the power card.

* * * * *